Figure 7:
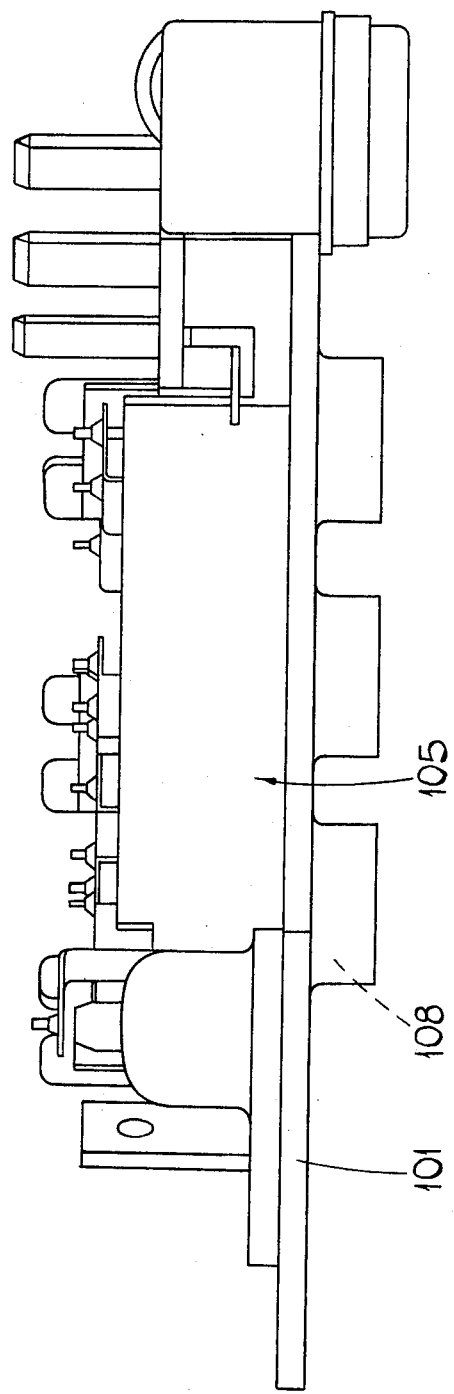

United States Patent [19]

Moore

[11] 4,065,686
[45] Dec. 27, 1977

[54] MULTIPHASE FULL-WAVE RECTIFIER ASSEMBLY

[75] Inventor: Alan Raymond Moore, Aldridge, England

[73] Assignee: Lucas Industries Limited, Birmingham, England

[21] Appl. No.: 744,173

[22] Filed: Nov. 22, 1976

[30] Foreign Application Priority Data

Dec. 20, 1975 United Kingdom ............... 52464/75

[51] Int. Cl.[2] ............................................ H02K 11/00
[52] U.S. Cl. .................................. 310/68 D; 363/145
[58] Field of Search ......................... 310/68 R, 68 D; 321/8 R

[56] References Cited

U.S. PATENT DOCUMENTS

| 3,422,339 | 1/1969 | Baker | 310/68 D |
|---|---|---|---|
| 3,527,971 | 9/1970 | Means | 310/68 D |
| 3,527,972 | 9/1970 | Franz et al. | 310/68 D |
| 3,629,631 | 12/1971 | Cotton et al. | 310/68 D |
| 3,739,210 | 6/1973 | Bahlinger et al. | 321/8 R X |
| 3,959,676 | 5/1976 | Striker | 321/8 R X |

*Primary Examiner*—William M. Shoop
*Attorney, Agent, or Firm*—Olson, Trexler, Wolters, Bushnell & Fosse, Ltd.

[57] ABSTRACT

A multiphase, full wave rectifier assembly comprises a first plate which carries a first set of diodes thereon, and a second plate which carries a second set of diodes thereon, the first and second plates being mutually isolated by an electrically insulating layer. Cathode terminals of the diodes of the first set extend with clearance through respective apertures in the second plate, and an electrical connector connects each of these cathode terminals to the anode terminal of a respective diode of the second set, said electrical connector being connectible to one of said phases to be rectified in use. A third set of diodes is carried by an electrically insulating body, one terminal of each diode of the third set being electrically connected to a respective one of the connectors, the other terminals of the diodes of the third set being connected to a common connector. Each connector is supported by the electrically insulating body and a respective insulating support member, the support member being secured in a recess defined between a pair of upstanding posts on the second plate.

An alternator comprises a housing having a rotor and a stator therein, an end cap overlying an end wall of the housing so as to define a cavity therebetween, and a multiphase, full-wave rectifier assembly as described above disposed in the cavity. The rectifier assembly is secured to the end cap, and screws detachably secure the rectifier assembly to the end wall of the housing. In this way, end cap is supported by the end wall through the intermediary of the rectifier assembly.

19 Claims, 17 Drawing Figures

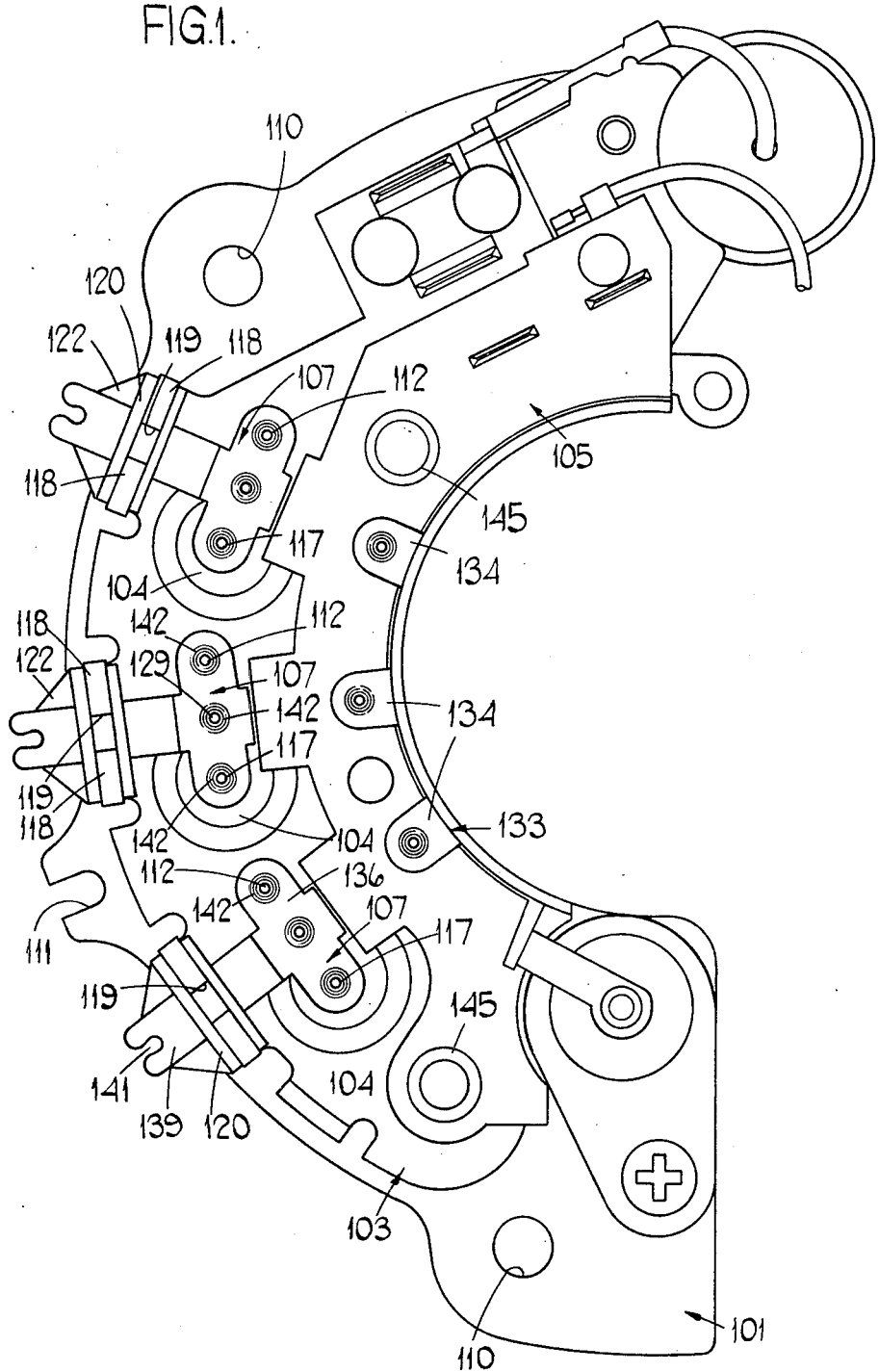

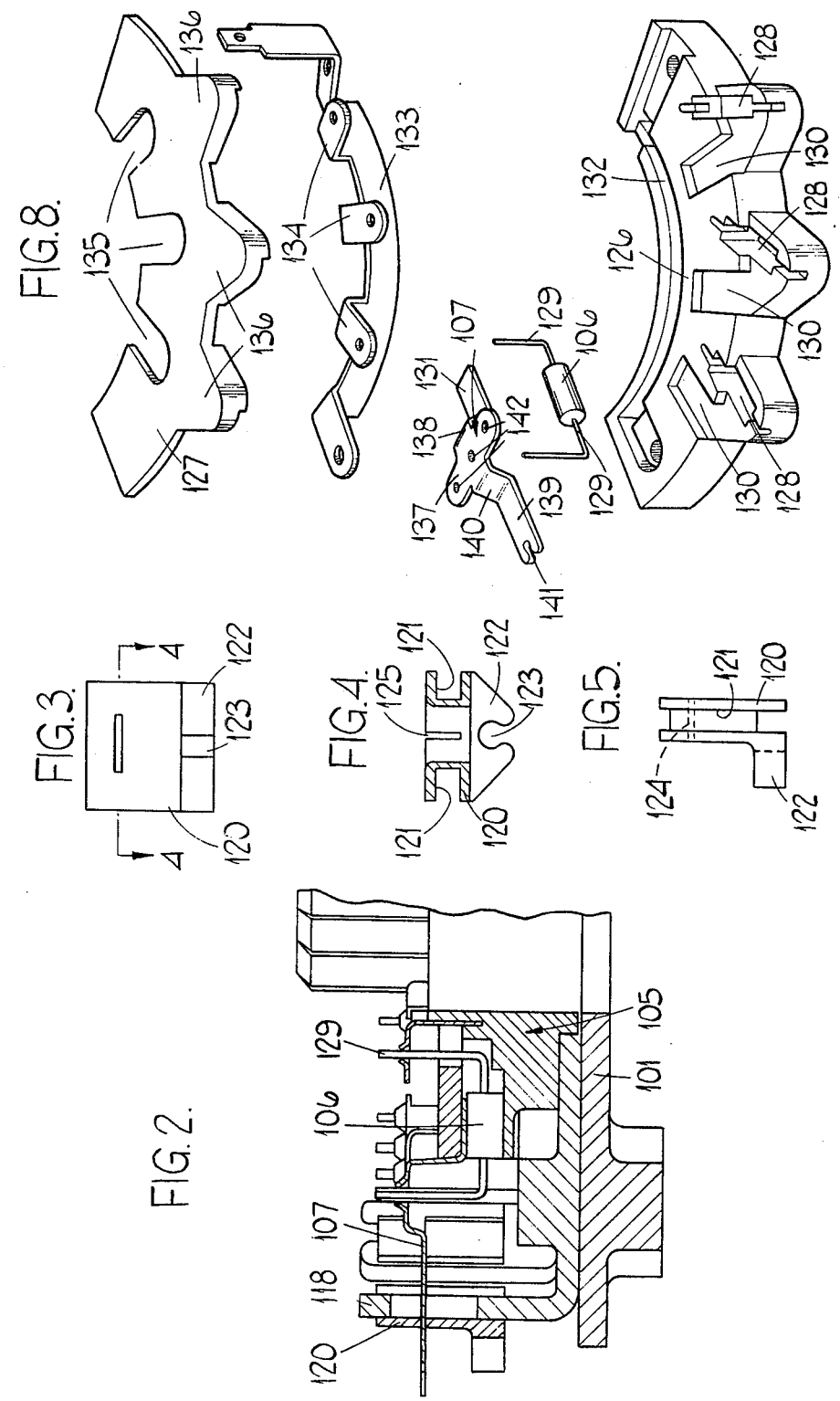

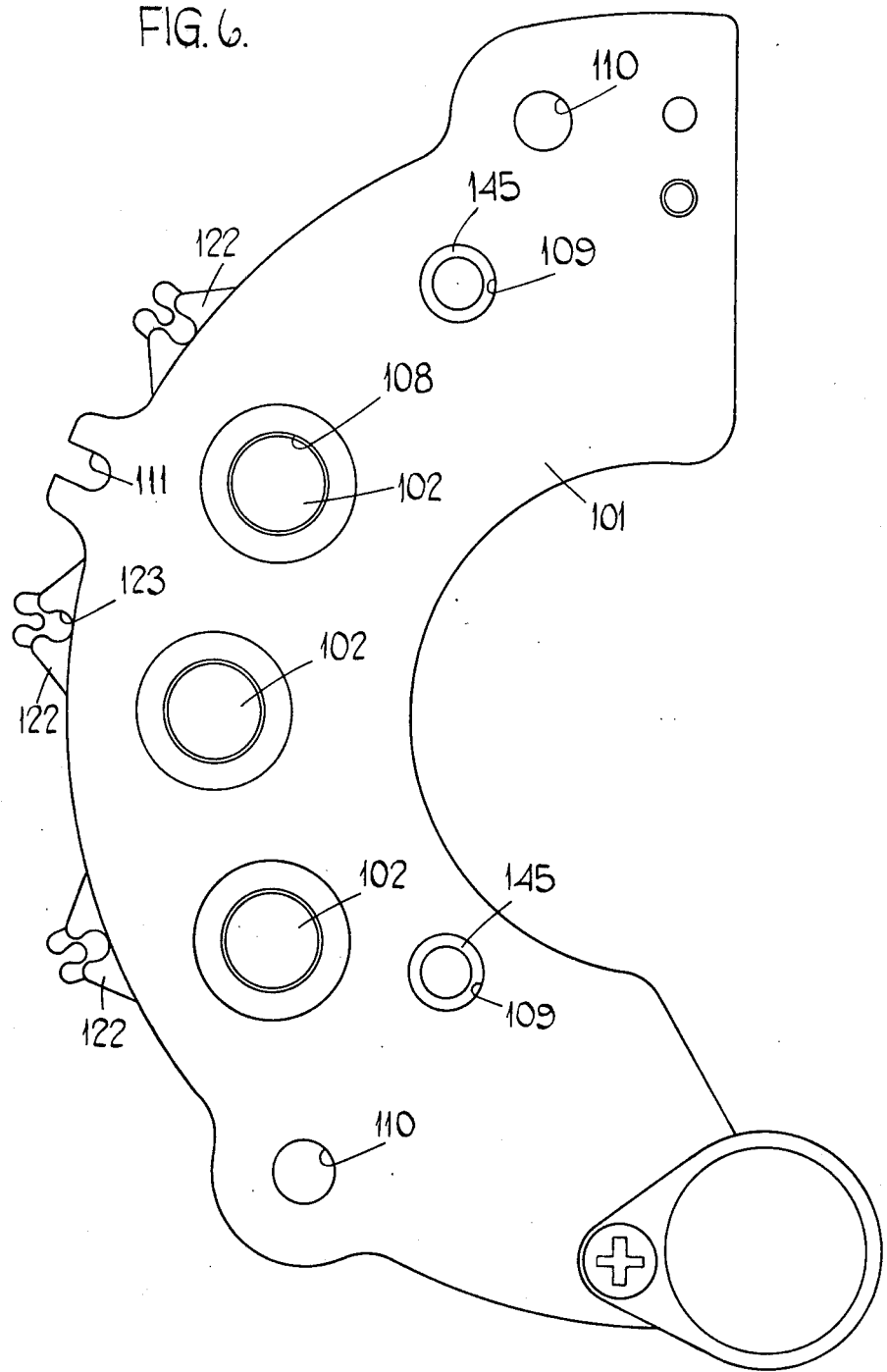

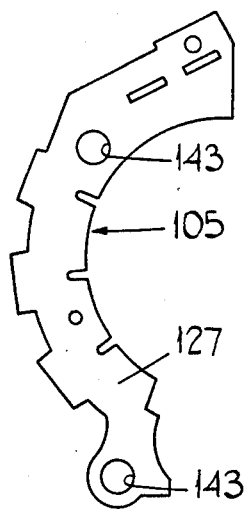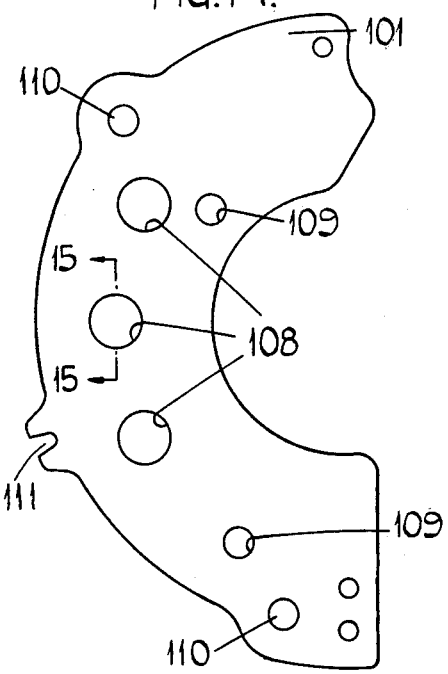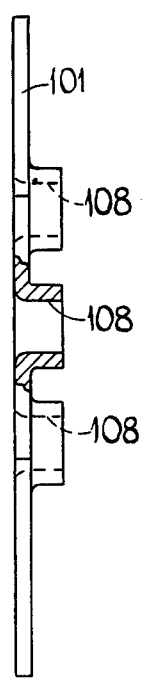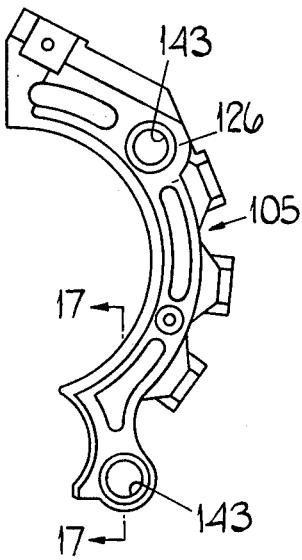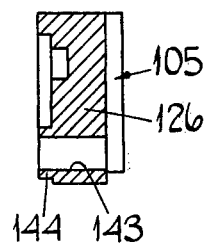

MULTIPHASE FULL-WAVE RECTIFIER ASSEMBLY

This invention relates to a multiphase, full-wave rectifier assembly and also to an alternator incorporating such an assembly.

It is an object of the present invention to provide a multiphase, full-wave rectifier assembly which is relatively simple to assemble.

According to one aspect of the present invention, there is provided a multiphase, full-wave rectifier assembly comprising a first plate, a second plate substantially parallel to the first plate, first and second sets of diodes carried by the first and secon plates respectively, terminals of the first set of diodes extending through holes in the second plate, a connector electrically connecting said terminal of each diode of the first set with a terminal of a respective diode of the second set and being adapted for connection to a respective phase to be rectified, and electrically insulating support means by which the connectors are at least partially supported, said support means being carried by carrier means on one or both of said first and second plates.

Preferably, the electrically insulating support means comprises a separate electrically insulating support member for each connector.

The carrier means is preferably provided on only one of the plates, most preferably the second plate.

In a convenient embodiment, the carrier means comprises a plurality of pairs of spaced posts providing recesses, in each of which recesses a respective one of the support members is engaged.

Each support member may be provided with a slot therethrough, the connector extending through the slot to be connectible, on one side of the member, with the respective phase to be rectified and, one the other side of the member, with the terminals of the respective diodes of the first and second sets.

Each support member may include a recessed portion which is adapted to engage and hold a lead carrying, in use, the phase to be rectified so that, in use, connection of a bared end of the lead to the respective connector is facilitated because the bared end of the lead is supported by the recessed portion in the desired position relative to the connector.

The rectifier assembly may further include a body for holding a further set of diodes, each diode of said further set having a terminal electrically connected to a respective one of said connectors, and another terminal electrically connected to a common connector for said further set of diodes.

Most advantageously, the arrangement of the plates, the connectors, the diodes, and the support means is such that the joints between the diode terminals and respective connectors are substantially coplanar to facilitate a flow soldering operation thereon.

Conveniently, each of the connectors for the first and second sets of diodes has a portion which is engaged in a recess in said body so that said connector is supported by said body and by said support means insulating support member in the desired position before the joints are made between the connector and the respective terminals of the diode.

According to another aspect of the present invention, there is provided a multiphase, full-wave rectifier assembly, comprising a first plate, a second plate substantially parallel to the first plate, first and second sets of diodes carried by the first and second plates respectively, terminals of the first set of diodes extending through holes in the second plate, a connector electrically interconnecting said terminal of each diode of the first set with a respective diode of the second set, a support structure in the form of an electrically insulating body having recesses therein, a further set of diodes disposed respectively in said recesses, said recesses being shaped so as to hold terminals of the diodes of the further set in predetermined relative positions, one of the terminals of each diode of the further set being electrically connected with a respective one of the connectors, and a common connector connecting together the other terminals of the diodes of the further set.

Preferably, the electrically insulating body comprises a first moulding having the recesses therein and a cover having portions overlying the recesses, the portions of the cover being shaped to prevent disengagement of the diodes of the further set from the recesses but to permit the terminals thereof to project from the body.

Preferably also, the body is provided with further recesses therein for receiving one end of each of the said connectors so that the connectors are at least partially supported by the body.

Preferably also, the body has another recess therein, in which recess the common connector is supported.

The insulating body may be provided with apertures therethrough which are aligned with aligned apertures through the plates, and fixing means extends through the apertures to secure the body and the plates together, the plates being electrically insulated from one another.

Also according to the present invention, there is provided an alternator comprising a housing, a rotor and a stator in said housing, said housing having an end wall, an end cap overlying the end wall to define a cavity between the cap and the end wall, a multiphase, full-wave rectifier assembly as defined hereinabove disposed in the cavity, means securing the end cap to the rectifier assembly, and detachable fixing means engaging the first plate of the rectifier assembly and the end wall to secure detachably the rectifier assembly on the end wall whereby the end cap is supported on the end wall through the intermediary of the rectifier assembly.

Figure 9:
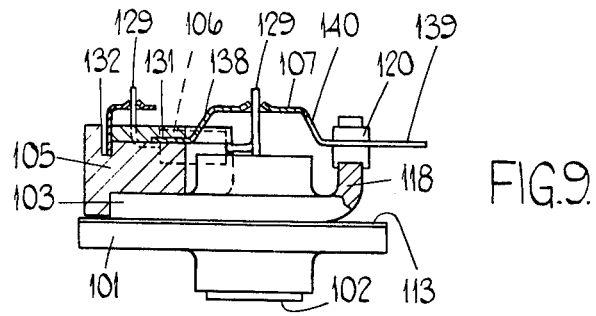
Figure 10:
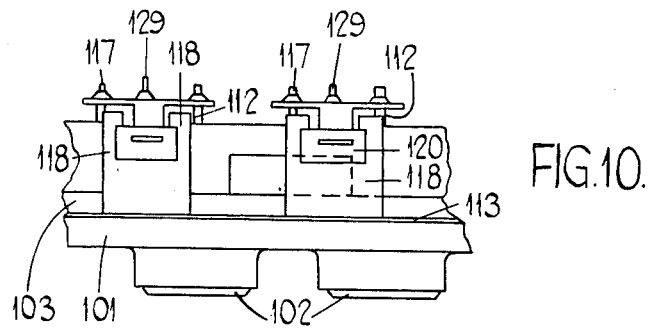
Figure 11:
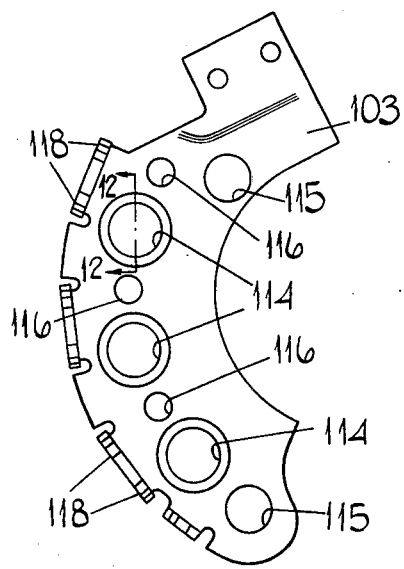
Figure 12:
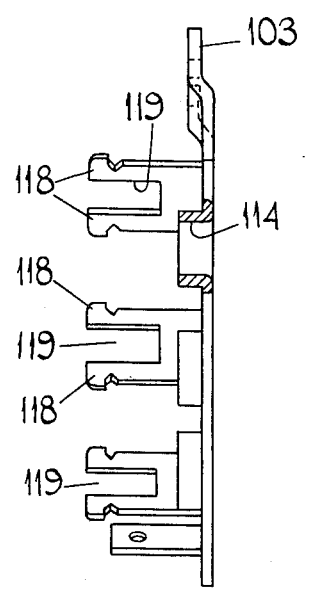

An embodiment of the present invention will now be described, by way of example, with reference to the accompanying drawings, in which:

FIG. 1 is a plan view on an enlarged scale of the multiphase, full-wave rectifier assembly according to the present invention, for an alternator, FIG. 2 is a cross-sectional view of part of the assembly of FIG. 1, FIG. 3 is a front elevation of an insulating member forming part of the assembly of FIGS. 1 and 2, FIG. 4 is a cross-sectional view on the line 4—4 of FIG. 3, FIG. 5 is a side elevation of the insulating member of FIG. 3, FIG. 6 is an underneath view of the assembly of FIG. 1, FIG. 7 is a side elevation of the assembly of FIG. 1, FIG. 8 is a schematic, exploded view, on a smaller scale, of part of the assembly of FIG. 1, but showing the part in a different form to that shown in FIG. 1, FIG. 9 is a cross-sectional view of the part of the assembly shown in FIG. 8, FIG. 10 is another view of part of the assembly of FIG. 1, FIG. 11 is a plan view of a positive plate forming part of the assembly of FIG. 1, FIG. 12 is a side elevation, of the positive plate of FIG. 11 with part of the plate being sectioned on the line 12—12 of FIG. 11, FIG. 13 is a plan view of a cover forming part of an electrically insulating body of the assembly of FIG. 1, FIG. 14 is a plan view of a negative plate of the assembly of FIG. 1, FIG. 15 is a side elevation of the negative plate of FIG. 14, with part of the plate being shown in a section on the line 15—15 of FIG. 4, FIG. 16 is an underneath plan view of part of the electrically insulating body of the assembly, and FIG. 17 is a section on the line 17—17 of FIG. 16.

Referring to the drawings, the rectifier assembly is a three phase, full-wave rectifier assembly which is intended to be mounted on an end wall 100 of an alternator for a motor vehicle, the alternator comprising a housing of which the end wall 100 forms part, a stator (not shown), a rotor (not shown) and an end cap (also not shown) which overlies the end wall 100 as viewed in FIG. 2 to define a cavity within which the rectifier assembly is located, in use.

The rectifier assembly comprises generally a negative plate 101 carrying three diodes 102, a positive plate 103 carrying another three diodes 104, and electrically insulating body 105 carrying a further three diodes 106, and three metal connectors 107.

The negative plate 101 has three aperture 108 therein (see particularly FIGS. 14 and 15) formed by a plunging operation and each diode 102 is mounted in a respective one of the apertures 108 so that its anode terminal is electrically connected with the negative plate 101. The negative plate 101 also has a pair of further apertures 109 therethrough which serve to enable the plate 101 to be secured to the plate 103 and the body 105, as will be described hereinafter. The negative plate 101 further has a pair of apertures 110 and a slot 111 therein which enables the rectifier assembly to be mounted on the aforementioned end wall 100 of the alternator housing, as will be described hereinafter. Each diode 102 has a cathode terminal 112 extending perpendicularly from the plate 101.

The positive plate 103 lies over the negative plate 101, extends parallel thereto and is electrically insulated therefrom by a thin electrically insulating layer 113 (see FIGS. 9 and 10). The electrically insulating layer 113 is sufficiently thin that the positive plate 103 is in heat exchange relationship with the negative plate 101. The positive plate 103 is provided with three plunged apertures 114 therein (see particularly FIGS. 11 and 12), each of which apertures 114 receives a respective one of the diodes 104 with its anode terminal electrically connected to the plate 103. The plate 103 is also provided with a pair of apertures 115 therein to enable the assembly of plates 101 and 103 and body 105 to be fastened together as will be described hereinafter. The plate 103 is further provided with a set of three apertures 116 therein. The apertures 116 are aligned with the diodes 102 when the plates 103 and 101 are secured together so that the cathode terminals 112 of the diodes 102 on plate 101 extend through the respective apertures 116 and are electrically isolated from the plate 103. Anode terminals 117 of the diodes 104 extend in parallel, spaced relationship with respect to each other and to the cathode terminals 112, and also extend perpendicularly with respect to the positive plate 103. The positive plate 103 is also formed with three pairs of integral posts 118 (see FIGS. 10, 11 and 12 — the posts 118 in FIG. 10 are only shown very diagrammatically). The posts 118 in each pair define therebetween a recess 119 within which is engaged an electrically insulating member 120 (see particularly FIGS. 1 to 5). Each insulating member 120 has a pair of opposed recesses 121 therein into each of which a respective post 118 is received. Each insulating member 120 is provided with an integral flange 122 having a rebated slot 123 therein. Each insulating member 120 also has a slit 124 therethrough, and a further slot 125, the latter slot 125 being provided for enabling deformation of the insulating member 120 to facilitate its mounting between the respective posts 118. The slit 124 receives part of a respective one of the metal connectors 107, as will be described hereinafter. The purpose of the rebated slot 123 will also be described hereinafter.

The insulating body 105 comprises an electrically insulating, synthetic plastics moulding 126 and an electrically insulating, moulded cover 127 (see FIGS. 8, 13, 16 and 17 in particular). The moulding 126 is provided with three spaced recesses 128 which are each configurated to receive the body and terminals 129 of a respective one of the diodes 106 so as to hold that diode 106 in the required position with the terminals 129 projecting upwardly from the moulding 126. The moulding 126 is also provided with another set of recesses 130 therein for receiving end portions 131 of the connectors 107, respectively. The moulding 126 also has a further recess 132 therein, said recess 132 receiving a common connector 133 for the diodes 106. The common connector 133 is provided with three connector tags 134 which are disposed externally of the body 105 and which receive one of the terminals 129 of a respective one of the diode 106.

The moulded cover 127 is, by reason of the provision of recesses 135 and projections 136, shaped to permit said one of the terminals 129 of each diode 106 to project externally of the body 105 and also to trap the end portions 131 of the connectors 107 and the diodes 106 within the body 105 when the cover 127 is assembled on the moulding 126.

Each of the metal connectors 107 is provided with an intermediate portion 137 which is integrally connected with the end portion 131 via a cranked portion 138. On the opposite side of the intermediate portion 137 to the cranked portion 138, the intermediate portion 137 is integrally united with a tongue 139 via a further cranked portion 140. Each tongue 139 passes through the slit 124 in the respective insulating member 120 and on the opposite side of the insulating member 120 to the intermediate portion 137, is provided with a rebated slot 141. The intermediate portion 137 is provided with three plunged holes 142 therethrough. The middle hole 142 receives the other of the terminals 129 of the respective diode 106, whilst the outer holes 142 received the cathode and anode terminals 112 and 117 of the diodes 102 and 104, respectively.

The arrangement of plates 101, 103, body 105, diodes 102, 104, and 106, and connectors 107 and 133 is such that the joints between the connectors 107 and diodes 102, 104 and 106, and between connector 133 and diodes 106 are all co-planar so that a flow soldering operation can be effected to solder the joints between the connectors and the diodes. This considerably facilitates manufacture of the rectifier assembly. Furthermore, before the soldering operation is effected, the connectors 107 are supported firmly in the desired position by reason of their engagement in the respective recesses 130 in the moulding 126 and by reason of their engagement in the respective slits 124 in the insulating members 120. Additionally, the common connector 133 is formly retained in position by reason of its engagement in the recess 132 in the moulding 126. Additionally, the diodes 106 which, as can be seen from the drawings, are relatively small, are also retained with their terminals 129 in the desired position by reason of their engagement in the configurated recesses 128 in the moulding 126.

To assemble the plates 101 and 103 and body 105, the plate 103, with its diodes 104 in position, is placed over the plate 101 with its diodes 102 in position, with the insulating layer 113 between the plates 101 and 103. The plates 101 and 103 are so mutually positioned that the terminals 112 of the diodes 102 pass with clearance through the apertures 116 in the plate 103 and so that the apertures 109 and 115 in the plates 101 and 103, respectively, are aligned. Then, the moulding 126 is placed over the plate 103 so that apertures 143 provided in the moulding 126 are aligned with the apertures 115, respectively. In the region of each aperture 143, the moulding 126 is provided with an integral bush 144 which, when the moulding 126 is assembled on the plate 103, passes into the respective aperture 115 in the plate 103. Following this, the diodes 106 are mounted in their respective recesses 128 in the moulding 126, and the common connector 133 and metal connectors 107 are mounted in position after the insulating member 120 have been engaged with their respective posts 118. After this, the cover 127 is fitted and the assembly of plates 101, 103, moulding 126 and cover 127 are secured together by means of eyelet rivets 145 passed through the apertures 143, 115 and 109. The provision of the bushes 144 ensures that each eyelet rivet 145, which is formed of metal and is therefore electrically conducting, does not become engaged with the plate 103 since it engages directly against the plate 101. With all the parts held firmly in the required positions, a flow soldering operation can be easily effected upon the joints between the connectors and the diode terminals.

When the rectifier assembly is to be mounted in the alternator, the end cap of the alternator is first mounted on the assembly by means of fixing screws (not shown) which pass through the eyelet rivets 145. Then, the end cap and rectifier assembly are mounted on the end wall 100 of the alternator housing using fixing screws which pass through the apertures 110 in the plate 101 and engage in threaded holes in the end wall 100. The screws used to effect this operation have heads which abut directly against the plate 101, thus effecting a metal to metal contact which not only improves the necessary electrical connection between the plate 101 and the end wall 100 of the alternator housing, but also ensures a firm mounting. It will thus be seen that the end cap of the alternator is mounted on the end wall of the alternator housing through the intermediary of the rectifier assembly. Apertures will be provided, of course, in alignment with the apertures 110 in the plate 101 to enable access to be gained to the fixing screws passing through said apertures 110. The end cap is also provided with further apertures therein to enable access to be gained to conductor leads from the phases of the stator to be rectified. There are three such leads provided and insulated portions thereof are clipped into the respective rebated slots 123 of the members 120 whilst bared ends thereof are clipped into the rebated slots 141 in the respective tongues 139. The joints between the bared ends of the conductors and the tongues 139 is rendered permanent by means of a soldering operation.

It will be appreciated from the above that the multi-wave rectifier assembly is relatively easy to manufacture because the connectors 107 and 113 are held in the desired positions, before a soldering operation is effected, by means of the insulating members 120 and the body 105.

The other parts of the rectifier assembly which have been illustrated in the accompanying drawings but which have not been described form no part of the present invention and therefore a description of such parts is deemed to be unnecessary.

I claim:

1. A multiphase full-wave rectifier assembly comprising a first plate, a first set of diodes carried by said first plate, a second plate disposed substantially parallel to said first plate and having holes therein, a terminal of each diode of said first set extending through a respective one of the holes in said second plate, a second set of diodes carried by said second plate, an electrical connector electrically interconnecting said terminal of each said diode of said first set with a respective diode of said second set and being adapted for connection to a respective phase to be rectified, a support structure including an electrically insulating body having recesses therein, a third set of diodes disposed in the recesses respectively, the recesses being shaped so as to hold the diodes of said third set in predetermined relative positions, each said diode of said third set having a body and a pair of terminals, one terminal of each said diode of said third set being electrically connected with a respective one of said electrical connectors, and a common electrical connector electrically connecting together the other terminals of said diodes of said third set.

2. An alternator comprising a housing, a rotor and a stator in said housing, said housing having an end wall, an end cap overlying the end wall to define a cavity between the cap and the end wall, a multiphase, full-wave rectifier assembly as claimed in claim 1, disposed in the cavity, means securing the end cap to the rectifier assembly, and detachable fixing means engaging the first plate of said rectifier assembly and the end wall to secure detachably the rectifier assembly on the end wall whereby the end cap is supported on the end wall through the intermediary of the rectifier assembly.

3. The alternator according to claim 2, wherein said securing means also serves to secure together individual components of said rectifier assembly.

4. The multiphase full-wave rectifier assembly according to claim 1, wherein each recess in said electrically insulating body includes a first portion which receives said body of the respective diode of said third set, and further portions which receive respectively said terminals of said respective diode, the further recess portions being shaped so as to hold said terminals of said diodes of said third set in predetermined relative positions.

5. The multiphase full-wave rectifier assembly according to claim 1, wherein said support structure also includes a cover having portions which overlie the recesses in said electrically insulating body, respectively, said cover portions being shaped so as to prevent disengagement of said diodes of said third set from the recesses but to permit said terminals of said diodes of said third set to project from said cover.

6. The multiphase full-wave rectifier assembly according to claim 5, wherein said cover is electrically insulating.

7. The multiphase full-wave rectifier assembly according to claim 1, wherein said electrically insulating body is provided with further recesses therein for receiving one end of each said electrical connector so that said electrical connectors are at least partially supported by said electrically insulating body.

8. The multiphase full-wave rectifier assembly according to claim 1, wherein said electrically insulating body has another recess therein which receives and supports said common electrical connector.

9. The multiphase full-wave rectifier assembly according to claim 1, wherein said first plate is provided with first apertures therein, said second plate is provided with second apertures therein, and said electrically insulating body is provided with third apertures therein, the first, second and third apertures being mutually aligned, and wherein fixing means extends through said aligned apertures and secures said electrically insulating body, said first plate and said second plate together, said first and second plates being electrically insulated from each other.

10. The multiphase full-wave rectifier assembly according to claim 1, wherein joints between said one terminals of said diodes of said third set and said electrical connectors are disposed substantially co-planarly with joints between said terminals of said diodes of said first set, said diodes of said second set and said electrical connectors, so as to facilitate a flow soldering operation on said joints.

11. The multiphase full-wave rectifier assembly according to claim 1, further comprising electrically insulating support means by which said electrical connectors are at least partially supported, and carrier means disposed on at least one of said first and second plates and carrying said electrically insulating support means.

12. The multiphase full-wave rectifier assembly according to claim 1, wherein said electrically insulating support means comprises a separate electrically insulating support member for each said electrical connector.

13. The multiphase full-wave rectifier assembly according to claim 12, wherein said carrier means comprises a plurality of pairs of spaced posts, and wherein a respective one of said support members is engaged between each said pair of spaced posts.

14. The multiphase full-wave rectifier assembly according to claim 12, wherein each said support member is provided with a slot therethrough, each said electrical connector extending through the slot in the respective support member to be connectible, on one side of said respective support member, with said respective phase to be rectified and, on the other side of said respective support member, with said terminal of the respective diode of said first set and with the respective diode of said second set.

15. The multiphase full-wave rectifier assembly according to claim 12, wherein each said support member includes a recessed portion which engages, in use, an electrical lead carrying said respective phase to be rectified, so that connection of a bared end of said electrical lead to the respective electrical connector is facilitated by said bared end supported by said recessed portion in a desired position relative to said respective electrical connector.

16. The multiphase full-wave rectifier assembly according to claim 11, wherein said carrier means is provided on only one of said first and second plates.

17. The multiphase full-wave rectifier assembly according to claim 16, wherein said carrier means is provided on said second plate only.

18. The multiphase full-wave rectifier assembly according to claim 11, wherein said first and second plates, said first and second sets of diodes, said electrical connectors and said support means are so located relative to each other that joints between said terminals of said diodes of said first set, said diodes of said second set, and said electrical connectors are disposed substantially co-planarly so as to facilitate a flow soldering operation on said joints.

19. The multiphase full-wave rectifier assembly according to claim 11, wherein said electrically insulating body has further recesses therein, and a portion of each said electrical connecter is engaged in a respective one of the further recesses, such that each said electrical connecter is supported jointly by said electrically insulating body and by said support means in a desired position so as to facilitate the forming of joints between said electrical connectors and said diodes of said first, second and third sets.

* * * * *